(12) United States Patent
Tian

(10) Patent No.: US 11,256,119 B2
(45) Date of Patent: Feb. 22, 2022

(54) BACKLIGHT MODULE, METHOD OF MANUFACTURING SAME, AND DISPLAY DEVICE

(71) Applicant: Wuhan China Star Optoelectronics Technology Co., Ltd., Wuhan (CN)

(72) Inventor: Dong Tian, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 149 days.

(21) Appl. No.: 16/625,733

(22) PCT Filed: Aug. 21, 2019

(86) PCT No.: PCT/CN2019/101743
§ 371 (c)(1),
(2) Date: Dec. 22, 2019

(87) PCT Pub. No.: WO2020/258474
PCT Pub. Date: Dec. 30, 2020

(65) Prior Publication Data
US 2021/0278588 A1    Sep. 9, 2021

(30) Foreign Application Priority Data

Jun. 25, 2019  (CN) .......................... 201910555557.4

(51) Int. Cl.
G02F 1/1333     (2006.01)
H05K 3/32       (2006.01)
F21V 8/00       (2006.01)
G02F 1/13357    (2006.01)
H05K 1/09       (2006.01)
H05K 3/00       (2006.01)
(Continued)

(52) U.S. Cl.
CPC ..... *G02F 1/133314* (2021.01); *G02B 6/0065* (2013.01); *G02B 6/0083* (2013.01); *G02B 6/0088* (2013.01); *G02F 1/1333* (2013.01); *G02F 1/1336* (2013.01); *H05K 1/09* (2013.01); *H05K 3/0011* (2013.01); *H05K 3/02* (2013.01); *H05K 3/28* (2013.01); *H05K 2201/0154* (2013.01)

(58) Field of Classification Search
CPC ............. G02B 6/0091; G02F 1/133314; G02F 1/133315; H05K 3/022; H05K 3/28
See application file for complete search history.

(56) References Cited

U.S. PATENT DOCUMENTS 7,922,380 B2 *  4/2011  Park ..................... G02B 6/0085
                                            362/631
8,164,704 B2 *  4/2012  Kim ..................... G02F 1/13454
                                             349/58
(Continued)

FOREIGN PATENT DOCUMENTS

CN        202486458        10/2012
CN        202915166         5/2013
(Continued)

*Primary Examiner* — Keith G. Delahoussaye

(57) ABSTRACT

A backlight module, a method of manufacturing the same, and a display device are provided. The backlight module includes a case provided with a via hole; and a flexible circuit board disposed in the via hole and having a size matching a size of the via hole.

9 Claims, 2 Drawing Sheets

(51) Int. Cl.
*H05K 3/02* (2006.01)
*H05K 3/28* (2006.01)

(56) References Cited

U.S. PATENT DOCUMENTS

| | | | | |
|---|---|---|---|---|
| 2007/0012475 | A1* | 1/2007 | Kawaguchi | H05K 3/4691 |
| | | | | 174/255 |
| 2012/0026424 | A1* | 2/2012 | Youk | G02B 6/0083 |
| | | | | 349/62 |
| 2015/0036301 | A1 | 2/2015 | Ooishi | |
| 2015/0131323 | A1* | 5/2015 | Tsai | B29D 11/00663 |
| | | | | 362/613 |
| 2015/0268412 | A1* | 9/2015 | Lee | G02B 6/0091 |
| | | | | 362/613 |
| 2015/0369996 | A1* | 12/2015 | Tsai | G02B 6/0068 |
| | | | | 362/612 |
| 2015/0370005 | A1* | 12/2015 | Tsai | G02B 6/0085 |
| | | | | 362/612 |
| 2018/0053981 | A1* | 2/2018 | Bae | H01P 11/003 |

FOREIGN PATENT DOCUMENTS

| | | |
|---|---|---|
| CN | 103363387 | 10/2013 |
| CN | 104279465 | 1/2015 |
| CN | 108037620 | 5/2018 |
| CN | 109683394 | 4/2019 |

\* cited by examiner

BACKLIGHT MODULE, METHOD OF MANUFACTURING SAME, AND DISPLAY DEVICE

RELATED APPLICATIONS

This application is a National Phase of PCT Patent Application No. PCT/CN2019/101743 having International filing date of Aug. 21, 2019, which claims the benefit of priority of Chinese Patent Application No. 201910555557.4 filed on Jun. 25, 2019. The contents of the above applications are all incorporated by reference as if fully set forth herein in their entirety.

FIELD AND BACKGROUND OF THE INVENTION

The invention relates to a field of backlights, and in particular to a backlight module, a method of manufacturing the same and a display device.

The full screen has become a mainstream direction of developing a mobile phone display. The full screen display pursues an ultra-narrow bezel, and with a popularity of the narrow bezel display, a backlight bezel is required to be further narrowed.

The backlight module is one of the important components of the liquid crystal display. Since the liquid crystal itself does not emit light, the backlight module is configured to function supplying a sufficient light source with uniform brightness and uniformity, so that the liquid crystal display can display images normally. At present, the display technology of liquid crystal displays has been maturing, especially in designs of the backlight modules. In addition to liquid crystal display devices such as liquid crystal displays, liquid crystal televisions and so on, the backlight module can also provide a light source for display devices such as digital photo bezels, electronic papers, and mobile phones, etc.

At this stage, in order to realize the narrow bezel at a lower end of the backlight, an L/B reverse assembling technology is usually employed. As shown in FIG. 1, a lower end of an iron case is provided with a receiving recess for placing a reverse assembled flexible circuit board, and an LED light is located on the flexible circuit board and has a height the same as a light guide plate, and a reflector is located under the light guide plate and also fixed on the recess of the iron case by a tape. In the flexible circuit board design, in order to align the height of the LED lamp with the light guide plate, the iron case needs to be designed in a stepped shape, and the recess is configured to accommodate a thickness of the flexible circuit board. The L/B reverse assembling design effectively narrows the lower end bezel of the backlight, but the stepped design of the iron case brings two problems. One is an increase in the thickness of the backlight, and a back side of the backlight is provided with protrusions, which occupy a space for assembly of the whole device. Another one is unevenness of the back side of the backlight, which impact its assembly with a glass and requires special platform fixtures to alleviate such impact.

SUMMARY OF THE INVENTION

In order to solve the above technical problem, the present invention provides a backlight module, a method of manufacturing the same, and a display device to solve the problem in the prior art that in order to align a height of an LED lamp with a light guide plate, the backlight module is usually designed to have an iron case of a stepped shape thereby enlarging a space for assembling the whole device.

A technical solution of the present invention is to provide a backlight module including a case provided with a via hole; a flexible circuit board disposed in the via hole and having a size matching a size of the via hole.

Further, the case includes a horizontal case and a vertical case perpendicular to the horizontal case, wherein the via hole is disposed on a side of the horizontal case adjacent to the vertical case.

Further, the backlight module further includes a light source disposed on the flexible circuit board; a light guide plate having a light incident side and a light exiting side and disposed in the case, wherein the light incident side is located at a side of the light guide plate, the light exiting side is perpendicular to the light incident side and away from the case, the light source is disposed on the light incident side of the light guide plate and having a height same as the light guide plate; a reflector disposed between the light guide plate and the case; a diffuser disposed on a light exiting side of the light guide plate; and an optical film disposed on a side of the diffuser away from the light guide plate.

Further, the flexible circuit board includes: a substrate disposed on a side of the via hole away from the light source; a conductive layer disposed on the substrate; and a protective layer disposed on a side of the conductive layer away from the substrate, wherein a first conductive adhesive layer is disposed between the substrate and the conductive layer, and a second conductive layer is disposed between the conductive layer and the protective layer.

Further, the substrate and the protective layer are both made of a material including polyimide.

Further, the conductive layer is made of a material including copper.

Further, the case is made of a material including metal.

The invention also provides a method of manufacturing a backlight module, including stamping to form a case, wherein a via hole is reserved before the stamping; and forming a flexible circuit board at the via hole, wherein the flexible circuit board has a size matching a size of the via hole.

Further, the step of forming a flexible circuit board includes: forming a substrate integrally with the case by injection molding; coating a first conductive adhesive on the substrate; depositing a metal layer on the first conductive adhesive, and etching a circuit structure on the metal layer to form a conductive layer; coating a second conductive adhesive on the conductive layer; and forming a protective layer covering the second conductive adhesive.

The invention also provides a display device including the backlight module.

The backlight module of the invention, the method of manufacturing the same and the display device combine an iron case and a flexible circuit board, and adopt an integrated injection molding technology to directly insert the flexible circuit board into the iron case. Such improvement directly avoids the iron case to be designed to have a recess for accommodating a thickness of the flexible circuit board, such that not only an overall thickness of the backlight can be reduced, but also a back side of the backlight can be flattened, thus being more conducive to subsequent assembly.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
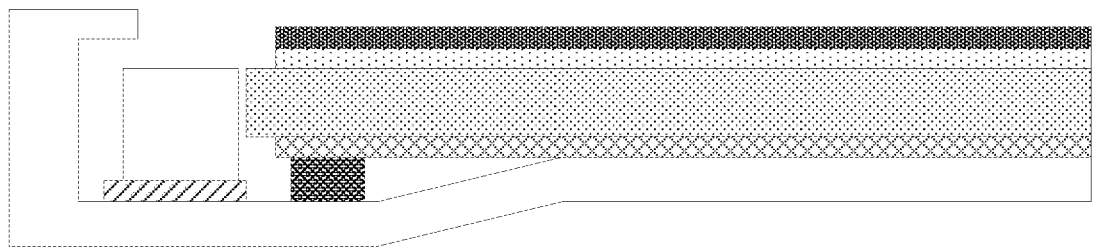
FIG. 1 is a schematic diagram of a backlight module in the background art.

Elements in the drawings are designated by reference numerals listed below.

1 display device;
10 backlight module;
100 case;
200 flexible circuit board;
300 light source;
400 light guide plate;
500 reflector;
600 diffuser;
700 optical film;
110 horizontal case;
120 vertical case;
401 light exiting side;
402 light incident side;
101 via hole;
210 substrate;
220 conductive layer;
230 protective layer;
201 first conductive adhesive.

DESCRIPTION OF SPECIFIC EMBODIMENTS OF THE INVENTION

The following description of the various embodiments is provided to illustrate the specific embodiments of the invention. The spatially relative directional terms mentioned in the present invention, such as "upper", "lower", "front", "back", "left", "right", "top", "bottom", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Embodiment

Figure 2:
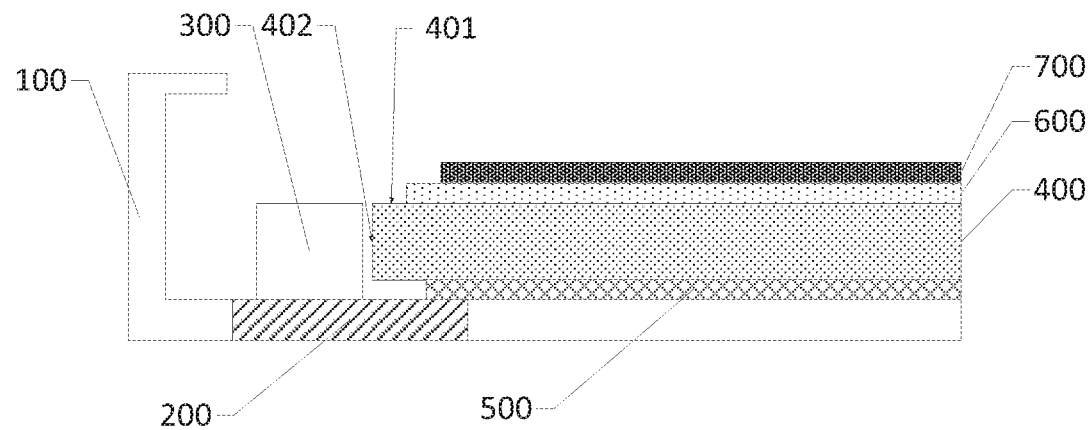
FIG. 2 is a schematic view of a backlight module in the embodiment.

As shown in FIG. 2, in the embodiment, the backlight module 10 of the present invention includes a case 100, a flexible circuit board 200, a light source 300, a light guide plate 400, a reflector 500, a diffuser 600, and an optical film 700.

Figure 4:
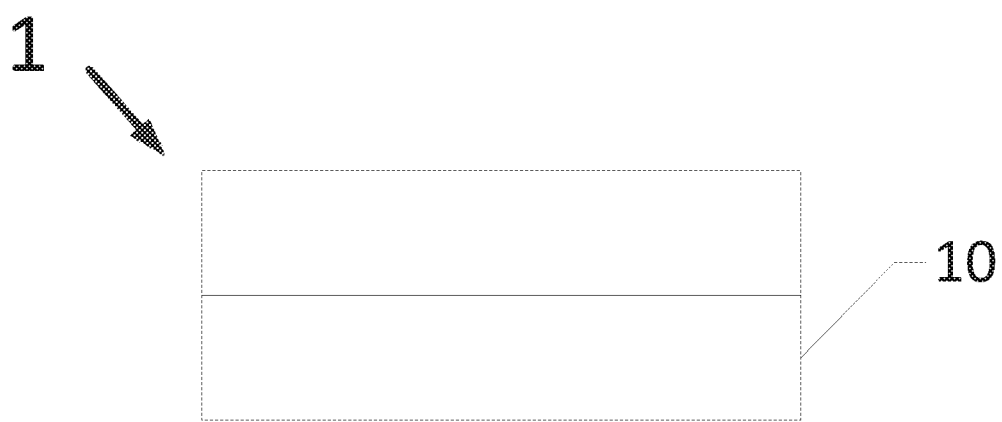
FIG. 4 is a schematic view of a display device in the embodiment.

As shown in FIG. 4, the backlight module 10 is configured to provide a uniform and soft light source for the display device 1 to display images. The display device 1 may be a product or a component having display functions, such as a mobile phone, a tablet computer, or the like, including the backlight module 10.

The case 100 is a metal case, generally an iron case, which has strong pressure and wear resistance and low cost. In the embodiment, the case 100 includes a horizontal case 110 and a vertical case 120 perpendicular to the horizontal case 110.

In this embodiment, the backlight module 10 is of an edge-lit type, and the light source 300 is disposed on a side of the horizontal case 110 adjacent to the vertical case 120, and is generally an LED light-emitting diode, which converts electrical energy into light energy to provide the light energy required by the backlight module 10.

Figure 3:
FIG. 3 is a schematic view of a flexible circuit board in the embodiment.

As shown in FIGS. 2-3, the flexible circuit board 200 is disposed between the light source 300 and the horizontal case 110 for providing electrical energy required by the light source 300. Specifically, the flexible circuit board 200 includes a substrate 210, a conductive layer 220, and a protective layer 230.

The substrate 210 is made of a material including polyimide for receiving the conductive layer 220. The conductive layer 220 is an electroplated copper plate on which a plurality of circuit traces are provided by engraving. The protective layer 230 is disposed on the conductive layer 220, and made of a material including polyimide for protecting the conductive layer 220 from water and oxygen corrosion, wherein polyimide is an insulating material, effectively preventing the conductive layer 220 from short circuit.

The light guide plate 400 is disposed on the case 110, and has a light incident side 402 and a light exiting side 401, wherein the light incident side 402 is located at a side of the light guide plate and right faces the light source 300, and the light exiting side 401 is perpendicular to the light incident side 402 and faces away from the horizontal case 110. In order to ensure that the light emitted by the light source 300 can be dissipated out to a maximum extent through the light guide plate 400, a side of the light source 300 away from the horizontal case 110 generally needs a height maintained the same as the light exiting side 401 of the light guide plate 400. However, since the flexible circuit board 200 is further disposed between the light source 300 and the horizontal case 110, in order to ensure the height of the light guide plate, in the prior art, the horizontal case 110 is generally designed as a stepped shape, but such a method makes a processing of the case 100 complicated, which increases the manufacturing cost and the difficulty of subsequent assembly.

In this embodiment, a via hole 101 is formed on a side of the horizontal case 110 adjacent to the vertical case 120, and the via hole 101 has a size matching a size of the flexible circuit board 200, which is conducive to complete embedment of the flexible circuit board 200 into the via hole 101, reducing the thickness of the backlight module 10. In addition, since the flexible circuit board 200 is embedded in the via hole, the light guide plate 400 can be directly disposed on the horizontal case 110, and thus it is not necessary to adopt a stepped horizontal case to ensure the height of the light exiting side 401 of the light guide plate 400.

The reflector 500 is disposed between the light guide plate 400 and the horizontal case 110 for reflecting light emitted by the light source 300 toward the horizontal case 110 through the light incident side 402 to the light exiting side 401, to improve the light-emitting efficiency of the backlight module 10, and increase image display quality of the display device.

The diffuser 600 is disposed on the light exiting side 401 of the light guide plate 400. The diffuser 600 is configured to improve a diffusion effect of the light emitted from the light exiting side 401, so that light distribution is more uniform and softer, and at the same time, light transmission is increased.

The optical film 700 is disposed on a side of the diffuser 600 away from the light guide plate 400. A type of the optical film 700 includes a prism, a diffusion film, or the like for improving optical performance of the backlight module 10.

In order to explain the present invention more explicit, the embodiment further provides a method of manufacturing the backlight module 10, including stamping to form a case 100, wherein a via hole 101 is reserved before the stamping; and forming a flexible circuit board 200 at the via hole 101, wherein the flexible circuit board 200 has a size matching a size of the via hole 101.

Specifically, the method of manufacturing the flexible circuit board is as follows: forming a substrate 210 integrally in the vie hole 101 by injection molding; coating a first conductive adhesive 201 on the substrate 210; depositing a metal layer on the first conductive adhesive 201, and etching a circuit structure on the metal layer to form a conductive layer 220; coating a second conductive adhesive 202 on the conductive layer 220; and forming a protective layer 230 covering the second conductive adhesive 202.

In this embodiment, assembly deviation of the flexible circuit board 200 and the case 100 is avoided by separating the molding process of the flexible circuit board 200, and by integrally forming the substrate 210 of the flexible circuit board 200 with the case 100, thus advantageously improving assembly precision of the backlight module 10.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A backlight module, comprising:
a case provided with a via hole;
a flexible circuit board disposed in the via hole and having a size matching a size of the via hole;
a light source disposed on the flexible circuit board;
a light guide plate having a light incident side and a light exiting side and disposed in the case, wherein the light incident side is located at a side of the light guide plate, the light exiting side is perpendicular to the light incident side and away from the case, the light source is disposed on the light incident side of the light guide plate and having a height same as a height of the light guide plate;
a reflector disposed between the light guide plate and the case;
a diffuser disposed on the light exiting side of the light guide plate; and
an optical film disposed on a side of the diffuser away from the light guide plate,
wherein the case comprises a horizontal case and a vertical case perpendicular to the horizontal case, wherein the via hole is provided on a side of the horizontal case adjacent to the vertical case; and
wherein the flexible circuit board comprises a substrate disposed on a side of the via hole away from the light source; a conductive layer disposed on the substrate; and a protective layer disposed on a side of the conductive layer away from the substrate, wherein a first conductive adhesive layer is disposed between the substrate and the conductive layer, and a second conductive layer is disposed between the conductive layer and the protective layer.

2. The backlight module according to claim 1, wherein the substrate and the protective layer are both made of a material comprising polyimide.

3. The backlight module according to claim 1, wherein the conductive layer is made of a material comprising copper.

4. The backlight module according to claim 1, wherein the case is made of a material comprising metal.

5. A display device comprising the backlight module according to claim 1.

6. The display device according to claim 5, wherein the case comprises a horizontal case and a vertical case perpendicular to the horizontal case, wherein the via hole is provided on a side of the horizontal case adjacent to the vertical case.

7. The display device according to claim 5, wherein the substrate and the protective layer are both made of a material comprising polyimide.

8. The display device according to claim 5, wherein the conductive layer is made of a material comprising copper.

9. The display device according to claim 5, wherein the case is made of a material comprising metal.

* * * * *

UNITED STATES PATENT AND TRADEMARK OFFICE
CERTIFICATE OF CORRECTION

| | |
|---|---|
| PATENT NO. | : 11,256,119 B2 |
| APPLICATION NO. | : 16/625733 |
| DATED | : February 22, 2022 |
| INVENTOR(S) | : Dong Tian |

It is certified that error appears in the above-identified patent and that said Letters Patent is hereby corrected as shown below:

On the Title Page

In item (54) and in the Specification, Column 1, Lines 1-3, Title:
Line 1, after "MODULE":
Insert the following: -- INCLUDING VIA THROUGH-HOLE --
Line 3, after "DEVICE":
Insert the following: -- COMPRISING SAME --

Signed and Sealed this
Eighteenth Day of October, 2022

Katherine Kelly Vidal
*Director of the United States Patent and Trademark Office*